United States Patent [19]
Kitch

[11] Patent Number: 6,140,238
[45] Date of Patent: Oct. 31, 2000

[54] SELF-ALIGNED COPPER INTERCONNECT STRUCTURE AND METHOD OF MANUFACTURING SAME

[75] Inventor: Vassili Kitch, San Ramon, Calif.

[73] Assignee: National Semiconductor Corporation, Santa Clara, Calif.

[21] Appl. No.: 09/295,838

[22] Filed: Apr. 21, 1999

Related U.S. Application Data

[63] Continuation-in-part of application No. 08/923,859, Sep. 3, 1997, Pat. No. 5,904,569.

[51] Int. Cl.[7] .......................... H01L 21/4763; H01L 29/45
[52] U.S. Cl. .......................... 438/687; 438/627; 438/636; 438/257; 438/653; 438/669; 438/685; 257/762; 257/768; 257/753
[58] Field of Search ..................... 438/687, 643, 438/648, 672, 675, 627, 636, 639, 653, 669, 685, 257; 257/762, 768, 769, 753; 205/15

[56] References Cited

U.S. PATENT DOCUMENTS

| | | | |
|---|---|---|---|
| 4,810,332 | 3/1989 | Pan | 205/15 |
| 4,917,759 | 4/1990 | Fisher et al. | 156/643 |
| 5,258,096 | 11/1993 | Sandhu et al. | 156/643 |
| 5,354,712 | 10/1994 | Ho et al. | 438/687 |
| 5,451,543 | 9/1995 | Woo et al. | 437/195 |
| 6,030,896 | 2/2000 | Brown | 438/687 |
| 6,037,223 | 3/2000 | Su et al. | 438/257 |

*Primary Examiner*—Matthew Smith
*Assistant Examiner*—Igwe U. Anya
*Attorney, Agent, or Firm*—Limbach & Limbach L.L.P.

[57] ABSTRACT

A copper interconnect structure is formed in a semiconductor device using self-aligned copper or tungsten via pillars to connect upper and lower copper interconnect layers separated by a dielectric. The lower copper interconnect layer is formed on an underlying layer. The via pillars are formed on the lower copper interconnect layer. The copper upper interconnect layer is formed to make electrical contact to exposed upper surfaces of the via pillars.

18 Claims, 2 Drawing Sheets

SELF-ALIGNED COPPER INTERCONNECT STRUCTURE AND METHOD OF MANUFACTURING SAME

RELATED APPLICATIONS

This application is a Continuation-In-Part of co-pending and commonly-assigned application Ser. No. 08/923,859, filed Sep. 3, 1997 now U.S. Pat. No. 5,904,569 titled METHOD FOR FORMING SELF-ALIGNED VIAS IN MULTI-LEVEL METAL INTEGRATED CIRCUITS.

TECHNICAL FIELD OF THE INVENTION

The present invention relates to fabrication of semiconductor integrated circuit structures. In particular, the invention relates to techniques for forming vias in multi-level metal integrated circuits using self-aligned copper-based via pillars and, preferably, copper as part of the upper level and lower level interconnect structure.

DESCRIPTION OF THE RELATED ART

Integrated circuits commonly use multi-level metal interconnects to reduce the layout area required for the tens or hundreds of thousands of semiconductor elements that typically form an integrated circuit structure. This reduction in layout area is possible because the metal layers used in multi-level metal schemes are separated by dielectric material that allows criss-crossing of the separated metal layers without electrical shorting. Electrical connections between metal layers are created by forming small apertures in the dielectric material and filling the apertures with a conducting material, e.g. aluminum. These connections, usually made between consecutive metal layers, are known as "vias."

As semiconductor device geometries continue to shrink into the submicron range, it is increasingly difficult to maintain planar metal and dielectric surfaces during the formation of multi-level metal interconnect structures. This lack of planarity can cause several problems. For example, if the underlying topography coated by a photoresist layer contains abrupt steps, then the thickness of the photoresist layer will not be uniform. This can occur, for example, when the photoresist is applied over features formed earlier in a semiconductor device process that protrude from the surface of the structure. The resulting non-uniformity in the photoresist thickness can lead to some regions of the patterned photoresist layer being insufficiently thick to protect underlying features during a later etching step and other regions being excessively thick so that the full thickness of the photoresist layer cannot be exposed due to the depth-of-focus limitations of photolithography at sub-micron dimensions. Also, poor planarity of metal and dielectric layers promotes poor metal step coverage which increases metal sheet-resistance, susceptibility to current-stress failure, electromigration problems and the probability of electrical opens. In addition, poor planarity in underlying metal or dielectric layers formed earlier in a semiconductor device process further increases the difficulty of establishing planarity in overlying metal or dielectric layers formed later in the process.

Another difficulty associated with via formation for multi-level metal interconnect structures in sub-micron architectures is the alignment of upper and lower metal layers with a via aperture formed in an intermediate dielectric. This alignment is difficult to achieve because of the small distance between device features in sub-micron devices and, thus, the reduced tolerance available for alignment errors.

Misalignment of a via relative to connected upper and lower metal layers can lead to reduced device yield, increased via resistance and poor metal coverage in the via. For example, in a standard via, misalignment of the via relative to the lower metal layer results in overetching into the dielectric underlying the lower metal layer, thereby increasing the aspect ratio of the via opening and preventing adequate step coverage when the via is later filled with metal. The result is a poor contact interface in the via and increased via resistance. Misalignment of an upper metal layer relative to a via results in overetching, or notching, of the lower metal layer. The notched lower metal layer exhibits increased current density and is, thus, more susceptible to failure from electromigration or current stress.

In many semiconductor devices, the layout dimensions of upper and lower metal layers connecting to vias are extended in the vicinity of the via to form a layout frame, or head, around the via. This is known as "framing" the via. The frame provides additional alignment margin such that if partial misalignment of an upper and lower metal layer relative to the intended via location occurs, the actual formed via will still overlie a portion of a lower metal layer or underlie a portion of an upper metal layer. However, an adverse effect of using framed vias in a semiconductor device layout is that the packing density is substantially decreased (or the layout area is substantially increased).

A third difficulty associated with via formation for multi-level metal interconnects in sub-micron architectures is the contact resistance of the vias caused by polymer residue formation during the etching of the vias. These residues are typically formed during plasma etching and may contaminate the bottom of the via, causing a poor metallurgical contact between the lower metal layer and the metal in the via.

Accordingly, a need exists for a method of forming a via for connecting multi-level metal interconnects in sub-micron semiconductor device architectures that improves the surface planarity of formed metal and dielectric layers, reduces problems associated with via misalignment, reduces contact resistance problems associated with polymer residues, and lowers associated manufacturing costs.

Commonly-assigned and co-pending application SerIAL No. (Attorney Docket No. NSC1-D1300), filed on the same date as this application, titled "Self-Aligned Interconnect Using High Selectivity Metal Pillars and a Via Exclusion Mask", discloses techniques for forming vias in multi-level metal ICs using self-aligned metal via pillars between interconnect levels. The metal via pillars include an upper surface that exhibits high selectivity in the etch of the upper metal interconnect layer.

As new integrated circuit manufacturing technologies emerge, it has become possible to use copper, instead of, for example, aluminum, in commercial metal interconnect structures.

SUMMARY OF THE INVENTION

The present invention provides a process for forming a copper-based interconnect structure using via pillars.

In accordance with one embodiment of the present invention, a lower interconnect layer includes a conductive diffusion barrier layer, a first copper layer formed on the diffusion barrier layer, and a conductive etch stop layer formed on the first copper layer. An upper layer of conductive material, e.g., copper or tungsten, is then formed on the etch stop layer. The metal stack is then etched. If the upper conductive layer is copper, then a conventional hardmask, e.g., $SiO_2$, is used to etch the upper copper layer, the etch stop layer, the first copper layer and the lower diffusion barrier layer to define the patterned metal stack. If the upper conductive layer is tungsten, then the tungsten itself can serve as a hardmask. In this case, patterned photoresist is used to etch through the tungsten; then the remainder of the stack is etched using the patterned tungsten as the hardmask.

Following definition of the metal stack, a thin layer of dielectric material, e.g., silicon oxynitride (SiON) or silicon nitride ($Si_3N_4$), having good barrier properties again copper diffusion is then deposited over the patterned metal stack. A first dielectric material is deposited, filling the gaps between the coated metal stack. The structure is then planarized using chemical mechanical polishing (CMP), leaving the upper surface of the upper conductive layer exposed. The exposed surface of the upper conductive layer is then masked and etched to define conductive via pillars, the etch stop layer of the lower interconnect layer serving as an etch stop to the via pillar etch. The sidewall surfaces of the via pillars that were exposed during the via pillar etch are then again coated with the barrier dielectric material and the gaps between the coated via pillars are filled with dielectric material. The dielectric material is then planarized to expose the upper surface of the via pillars. An upper conductive layer, preferably copper-based, is then formed in electrical contact with the exposed upper surfaces of the via pillars. This completes the fabrication of two copper-based interconnect layers with conductive via pillars formed between the two interconnect layers.

A better understanding of the features and advantages of the present invention will be obtained by reference to the following detailed description and accompanying drawings which set forth an illustrative embodiment in which the principles of the invention are utilized.

DETAILED DESCRIPTION

FIGS. 1–6 illustrate a process for forming a self-aligned copper-based pillar for use as a via to connect upper and lower layers of metal interconnect, preferably copper in both cases, in a semiconductor device in accordance with an embodiment of the present invention.

Figure 1:
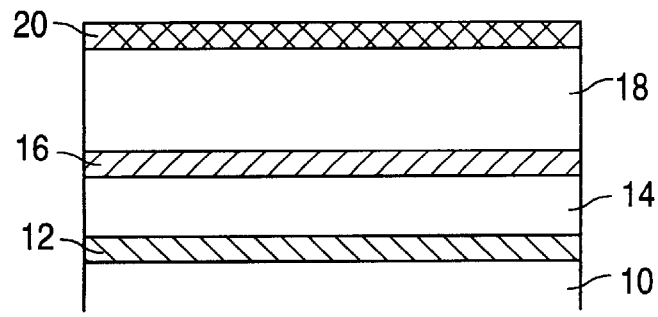
FIGS. 1–5 illustrate process steps of a method in accordance with the present invention.

In the disclosed process, as shown in FIG. 1, a first layer 10 of dielectric material, e.g. silicon oxide, is deposited overlying a semiconductor substrate (not shown). A layer 12 of diffusion barrier material is then deposited over the first dielectric layer 10. The diffusion barrier layer 12 may be tantalum, tantalum nitride, tungsten, tungsten nitride, titanium, titanium nitride, or any other conductive material that performs well as a diffusion barrier to copper.

Although dielectric layer 10 is described above as formed over a silicon substrate, those skilled in the art will appreciate that it is possible for numerous structures, such as field oxide regions, polysilicon regions, metal regions and active device regions, to underlie dielectric layer 10, all in accordance with the concepts of the present invention. These underlying structures do not directly effect the practice of the invention because layer 10 is planarized using an etchback method, spin on glass (SOG), reflow, CMP or similar processing before forming overlying layers thereon. For example, layer 10 can be a deposited silicon dioxide ($SiO_2$) layer planarized by CMP or by an etchback, as is well known in the art.

Next, a layer 14 of copper is formed over the diffusion barrier layer 12. A conductive etch stop layer 16 is then deposited on the copper layer 14. The etch stop layer 16 must be both a good etch stop material during copper etch as well as a good barrier against copper diffusion. Tungsten, tungsten nitride and tungsten silicide are suitable for this purpose when the overlying layer 18 is copper (titanium nitride and tantalum nitride are suitable when the overlying layer 18 is tungsten, as discussed below).

A second layer 18 of copper is then deposited on the etch stop layer 16. Finally, a thick oxide layer 20 is deposited overlying the second copper layer 18 to serve as a hardmask for the etch of the metal stack. The resulting structure is shown in FIG. 1. The hardmask is needed because photoresist will not survive the high temperatures (~300° C.) needed to etch copper. Silicon dioxide ($SiO_2$) is a suitable choice for the hardmask material.

Figure 2:
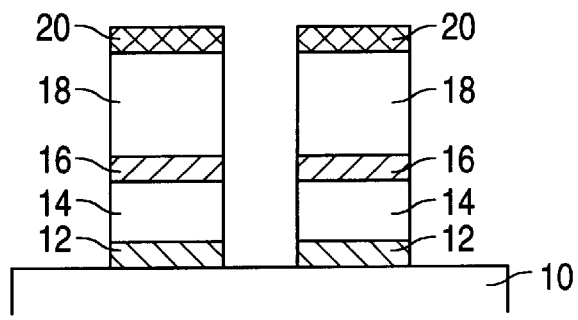

Following deposition of the hardmask layer 20, the layer 20 is masked and patterned in the conventional manner to provide a hardmask for the subsequent etching of the underlying layers. The patterned hardmask layer 20 is then used to etch the second copper layer 18, the etch stop layer 16, the first copper layer 14 and the lower diffusion barrier layer 12 to define a patterned metal stack, as shown in FIG. 2.

In an alternative embodiment of the invention, layer 18 may comprise tungsten. In this case, the tungsten itself may serve as a hardmask for etching the underlying layers and no oxide hardmask is required; patterned photoresist is used to etch through the tungsten and then the remainder of the metal stack is etched using the patterned tungsten as the hardmask. In this case, titanium nitride, tantalum nitride, or any other material having good diffusion barrier characteristics with respect to copper and high tungsten etch selectivity may be used for etch stop layer 16.

Figure 3:
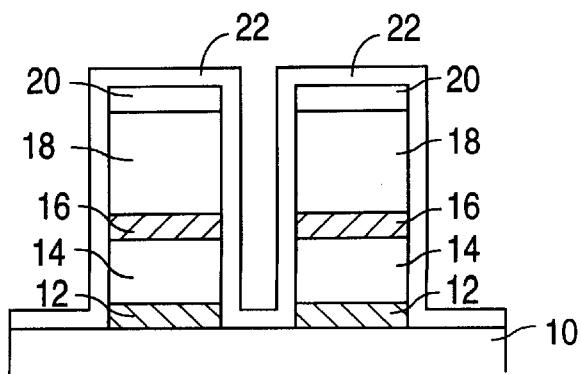

Referring to FIG. 3, following definition of the metal stack, a thin layer 22 of dielectric material, e.g. silicon nitride (SiON), having good barrier properties against copper diffusion is deposited over the patterned structure.

Figure 4:
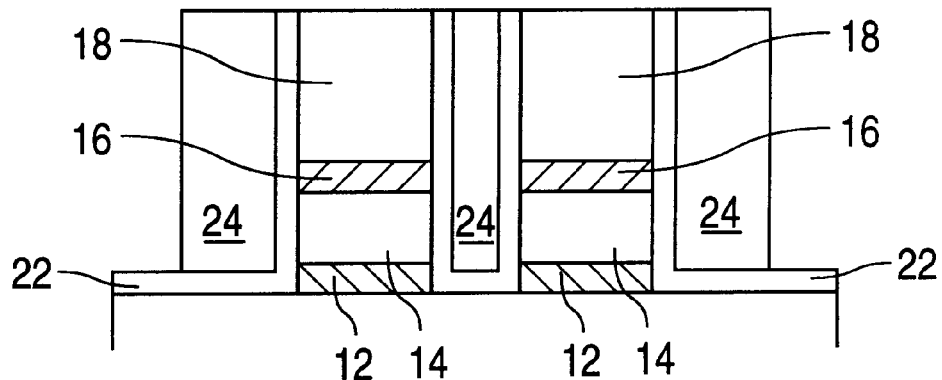

Next, a second dielectric layer 24, e.g. silicon oxide, is deposited, using High Density Plasma (HDP) oxide deposition or spin on dielectric (SOD) for example, overlying the exposed first dielectric layer 10 and filling the gaps between the patterned metal stack. Those skilled in the art will appreciate that dielectrics other than HDP silicon dioxide, either organic or inorganic can be utilized, and applied in different, well-known ways (e.g. spin-on). The wafer is then planarized using a Chemical Mechanical Processes (CMP) to expose the upper surface of the upper conductive (e.g., copper or tungsten) layer 18, as shown in FIG. 4.

Figure 5:
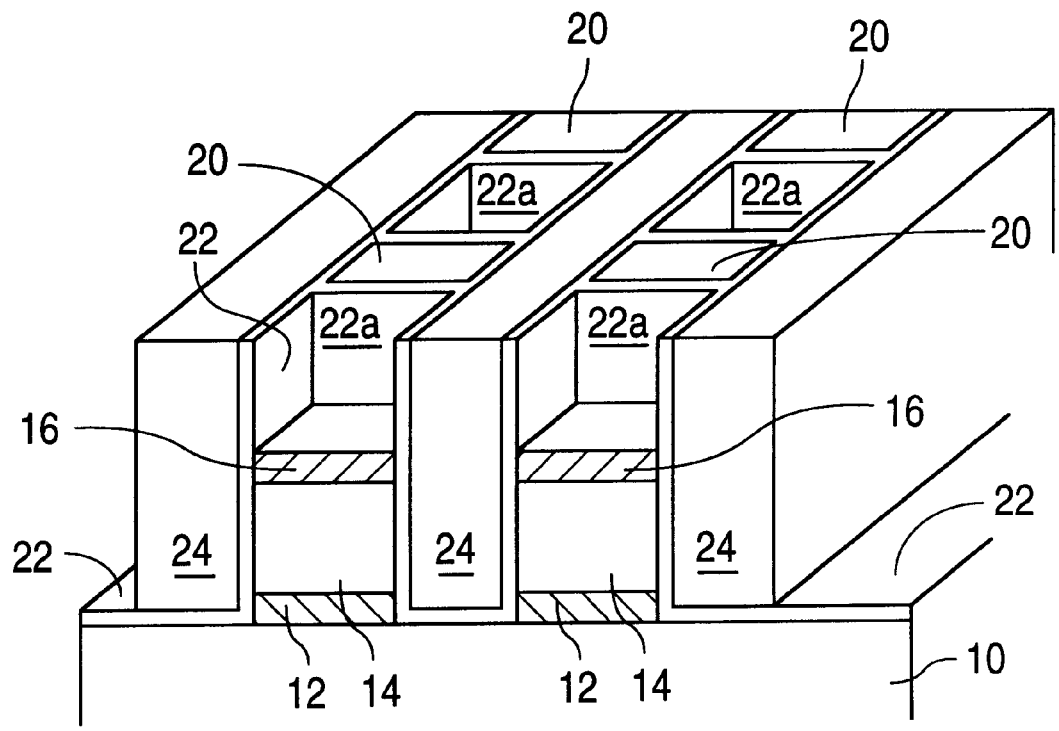

The exposed upper surface of the upper conductive layer 18 is then patterned using a via exclusion mask (not shown) and etched down through the layer 18 to form conductive via pillars, underlying etch stop layer 16 serving as an etch stop to etching of the layer 18. If layer 18 is copper, then a new dielectric diffusion barrier layer 22a is formed on exposed sidewalls of the via pillars. (There is no need for a new diffusion barrier layer if the via pillars are tungsten.) The resulting structure is shown in FIG. 5.

A third layer 26 of dielectric material, e.g. silicon oxide, is then deposited overlying the wafer and filling the gaps between the coated via pillars. The wafer is then planarized, e.g., using CMP, thereby exposing the upper surface of the via pillars.

A third upper layer of conductive material (not shown), e.g., copper, is then deposited overlaying the structure and patterned to contact the upper surface of the via pillars, thus connecting two levels of metal interconnect in a semiconductor device.

Those skilled in the art will appreciate that the above-described steps can be repeated as many times as needed to form a desired multilevel interconnect structure.

Various other modifications and alterations in the structure and method of fabrication of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the invention and that structures and methods within the scope of these claims and their equivalents be covered thereby.

What is claimed is:

1. A method of forming a conductive via between a lower copper interconnect layer and an upper copper interconnect layer in a semiconductor device structure, the method comprising:

forming a lower conductive diffusion barrier layer on an underlying layer as part of the semiconductor device structure;

forming a first copper layer on the lower diffusion barrier layer;

forming an etch stop layer on the first copper layer, the etch stop layer having a high etch selectivity with respect to copper;

forming a second copper layer on the etch stop layer;

forming a layer hardmask material on the second copper layer;

patterning the layer of hardmask material to define a patterned hardmask;

using the patterned hardmask to etch the second copper layer, the etch stop layer, the first copper layer and the lower diffusion barrier layer to form a patterned metal stack and to expose portions of the underlying layer;

forming a layer of dielectric diffusion barrier material over the patterned metal stack;

forming a first dielectric layer such that the first dielectric layer fills gaps between the patterned metal stack;

planarizing the first dielectric layer to expose an upper surface of the second copper layer;

etching regions of the second copper layer using the etch stop layer as an etch stop, thereby defining spaced-apart copper via pillars;

forming a second dielectric diffusion barrier layer over the copper via pillars;

forming a second dielectric layer such that the second dielectric layer fills gaps between the copper via pillars;

planarizing the second dielectric layer to expose an upper surface of the copper via pillars; and forming a patterned upper copper interconnect layer overlying the exposed copper via pillars, whereby the copper via pillars form vias between the lower copper interconnect layer and the upper copper interconnect layer.

2. A method as in claim 1, and wherein the underlying layer comprises a layer of dielectric material.

3. A method as in claim 1, and wherein the diffusion barrier layer is formed of a material selected from the group consisting of tantalum, tantalum nitride, tungsten, tungsten nitride, titanium, titanium nitride, and combinations thereof.

4. A method as in claim 1, and wherein the dielectric diffusion barrier layer comprises silicon oxynitride.

5. A method as in claim 1, and wherein the dielectric diffusion barrier layer comprises silicon nitride.

6. A method as in claim 1, and wherein the etch stop layer is formed of a material selected from the group consisting of tungsten, tungsten nitride, tungsten silicide, and combinations thereof.

7. A method as in claim 1, and wherein the hardmask material comprises an oxide of silicon.

8. A method as in claim 1, and wherein the hardmask material is silicon dioxide.

9. An interconnect structure formed as part of a semiconductor device structure, the interconnect structure comprising:

a conductive patterned lower interconnect layer formed on an underlying layer as part of the semiconductor device structure;

conductive via pillars formed in spaced-apart relationship on an upper surface of the lower interconnect layer, the via pillars including copper or tungsten; and a conductive patterned upper interconnect layer formed in electrical contact with the via pillars.

10. A interconnect structure as in claim 9, and wherein the lower interconnect layer includes a diffusion barrier layer formed on the underlying layer, a first copper layer formed on the diffusion barrier layer and an etch stop layer formed on the first copper layer.

11. An interconnect structure as in claim 10, and wherein sidewalls of the lower interconnect layer are covered by a layer of dielectric diffusion barrier material.

12. An interconnect structure as in claim 11, and wherein the dielectric diffusion barrier material comprises silicon oxynitride or silicon nitride.

13. An interconnect structure as in claim 11, and wherein sidewalls of the via pillars are covered by dielectric diffusion barrier material.

14. An interconnect structure as in claim 10, and wherein the diffusion barrier layer comprises a material selected from the group consisting of tantalum, tantalum nitride, tungsten, tungsten nitride, titanium, titanium nitride, and combinations thereof.

15. An interconnect structure as in claim 10, and wherein the etch stop layer comprises a material selected from the group consisting of tungsten, tungsten nitride, tungsten silicide, titanium nitride, tanatalum nitride, and combinations thereof.

16. An interconnect structure as in claim 9, and wherein the via pillars comprise a second copper or a tungsten layer formed on the lower interconnect layer.

17. An interconnect structure as in claim 9, and wherein the upper interconnect layer includes copper.

18. A method of forming a conductive via between a lower copper interconnect layer and an upper copper interconnect layer in a semiconductor device structure, the method comprising:

forming a lower conductive diffusion barrier layer on an underlying layer as part of the semiconductor device structure;

forming a first copper layer on the lower diffusion barrier layer;

forming an etch stop layer on the first copper layer, the etch stop layer having a high etch selectivity with respect to copper;

forming a layer of tungsten on the etch stop layer;

forming a patterned photoresist mask on the tungsten layer;

using the patterned photoresist mask to etch the tungsten layer to define a patterned tungsten layer;

using the patterned tungsten layer as a hardmask to etch the stop layer, the first copper layer and the diffusion barrier layer to define a patterned metal stack;

removing the remaining patterned photoresist mask;

forming a layer of dielectric diffusion barrier material over the patterned metal stack;

forming a first dielectric layer such that the first dielectric layer fills gaps between the patterned metal stack;

planarizing the first dielectric layer to expose an upper surface of the tungsten layer;

etching regions of the tungsten layer using the etching stop layer as an etch stop, thereby defining space-apart tungsten via pillars;

forming a second dielectric diffusion barrier layer over the tungsten via pillars;

forming a second dielectric layer such that the second dielectric layer fills gaps between the tungsten via pillars;

planarizing the second dielectric layer to expose an upper surface of the tungsten via pillars; and forming a patterned upper copper interconnect layer overlying the exposed tungsten via pillars, whereby the tungsten via pillars form vias between the lower and upper copper interconnect layers.

* * * * *